United States Patent [19]

LeChevalier

[11] Patent Number: 4,998,109

[45] Date of Patent: Mar. 5, 1991

[54] ANALOG TO DIGITAL CONVERSION DEVICE BY CHARGE INTEGRATION USING DELAY-LINE TIME MEASUREMENT

[76] Inventor: Robert E. LeChevalier, 354 Tramway Dr., Milpitas, Calif. 95035

[21] Appl. No.: 450,286

[22] Filed: Dec. 13, 1989

[51] Int. Cl.[5] ............................................. H03M 1/50
[52] U.S. Cl. ..................................... 341/166; 341/155
[58] Field of Search ............... 341/166, 142, 155, 167, 341/168, 169, 170, 159, 161

[56] References Cited

U.S. PATENT DOCUMENTS

| | | | |
|---|---|---|---|
| 3,906,400 | 9/1975 | Gooding et al. | 341/77 X |
| 4,471,341 | 9/1984 | Sauer | 341/161 |
| 4,742,333 | 5/1988 | Willhite | 341/159 |
| 4,831,380 | 5/1989 | Gimblett | 341/166 |

*Primary Examiner*—William M. Shoop, Jr.
*Assistant Examiner*—Brian K. Young

[57] ABSTRACT

An analog to digital converter for high-speed, high-accuracy conversion includes a charge storage means for storing an input analog value to be converted, means for controlling discharge of the charge storage means, a comparator means for sensing discharge level of said charge storage means and transmitting a stop signal at a precise time, a tapped delay line means which is responsive to a start signal to generate a sequence of binary values, a first register means responsive to the stop signal for capturing the binary values corresponding to a delay time between the start and the stop signal, and an encoder means coupled to the register means for converting the binary values to a digital value representative of the input analog value. In a further embodiment, a counter means and a second register means are employed in parallel with the tapped delay line means and the first register means in connection with a frequency reference to provide digital conversion over a wide dynamic range, the first register means and the tapped delay line means capturing input binary values over at least one cycle of the frequency reference which is one count of the counter.

9 Claims, 4 Drawing Sheets

ANALOG TO DIGITAL CONVERSION DEVICE BY CHARGE INTEGRATION USING DELAY-LINE TIME MEASUREMENT

FIELD OF THE INVENTION

This invention relates to a conversion device used in electronic systems, known as an analog-to-digital converter, herein referred to as an ADC. This invention relates specifically to those ADC's which are characterized by extreme accuracy of resolution in conjunction with a high rate of conversion operation.

PRIOR ART

Many electronic systems, including those in radar, sonar, medicine, and communications, commonly use a type of electronic device for converting analog electrical signals of continuous voltages or currents into equivalent binary digital signal representations of one's and zero's. The reason for this conversion process is that certain kinds of signal processing are easier, faster, or more economical when accomplished digitally, or that equivalent analog processing may not be possible at all.

The technology of analog to digital converters, or ADC's as they are commonly referred to, has evolved many different device architectures and methods to optimize the conversion process for different requirements of accuracy, conversion rate, manufacturing cost, and various other less significant criteria. Three architectures stand out as being representative of the concepts most commonly found in commercial ADC's being sold today, the flash converter (Staffin and Lohman, U.S. Pat. No. 2,869,079, 1959; Fraschilla, Caveney, and Harrison, U.S. Pat. No. 3,597,761, 1971), the successive approximation converter (Kaiser, Lane, and Shockency, U.S. Pat. No. 2,734,396, 1957; Gordon and Colton, U.S. Pat. No. 2,997,704, 1961), and the charge-integrating converter (Oliver and Shannon, U.S. Pat. No. 2,801,281, 1948; Dickenson, U.S. Pat. No. 2,872,670, 1959; Anderson and Dorey, U.S. Pat. No. 3,267,458, 1966; Ohshausen and Lutes, U.S. Pat. No. 3,281,827, 1966; and others). These three are not the only architectures, but are merely representative of the basic principles found in ADC's made today. These three also represent the range of performance and cost found in today's converters, from the flash, which is the fastest and most expensive, but least accurate, to the successive approximation, which has moderate accuracy, moderate speed, and moderate cost, to the charge-integrating, which is the most accurate, slowest, but least expensive.

With the progress of electronics systems technology, there is an increasing demand for faster and more accurate, but less expensive ADC's than can be found in the flash, successive approximation, and charge-integrating types of converters.

The flash converter works on a principle that utilizes a large number of precision voltage comparators to simultaneously sense every voltage level that is to be resolved in an analog input signal. The number of comparators employed equals the number of resolved voltage levels, herein referred to as the resolution of an ADC. The advantage of the flash converter is that the analog-to-digital conversion is accomplished in only one step, and so a single conversion takes very little time. But accurate conversion in present day technology can require 1000 or more voltage levels, and at this resolution a flash converter of 1000 or more comparators grows too complex to manufacture economically or practically. Present day ADC requirements exist to sense 4000 or more voltage levels, and so the flash converter architecture has little room to grow.

Another problem with the flash converter is that every comparator must be simultaneously driven by the analog input signal. Every comparator presents some capacitive, resistive, or other loading to the analog source, and together the loading of a large number of comparators can slow down conversion operation, or require expensive buffering circuitry to isolate the analog source from the loading effects of the flash converter. These problems are well known by those skilled in the art.

To summarize, the flash converter suffers from two major drawbacks:

(a) when highly accurate, it is very complex and expensive to manufacture;

(b) it presents a heavy electrical load to the electrical source of the analog signal being converted.

The successive approximation converter, herein referred to as SAC, works on the principle of using a sequence of comparisons to resolve an analog signal. The principle advantage over a flash converter is that the SAC only requires one comparator, regardless of the resolution accuracy of the converter, so the physical complexity, and hence the manufacturing cost of the SAC, is less than an equivalently accurate flash converter. The principle disadvantage of the SAC is that it requires multiple steps to complete a conversion, whereas a flash requires only one step. The number of conversion steps in a SAC is equal to the base 2 logarithm of the number of analog levels being resolved, rounded up to the next integer value. For example, the logarithm to the base 2 of 1000 voltage levels is approximately 9.97. Rounded up to 10 this is the number of steps required by a SAC. Parenthetically, this number is also the number of binary bits of accuracy for any converter, regardless of method or architecture. Consequently, because of the extra processing steps, a SAC is considerably slower than a flash converter, though it is faster than many other techniques such as the charge-integrating converter.

The charge-integrating converter works by the principle of storing an analog input voltage as a charge on a capacitance, and then discharging the capacitance at a uniform rate. By this method, the time it takes to completely discharge the capacitor is designed to be proportional to the magnitude of the input voltage. The discharge time interval is measured using a digital counter to accumulate the number of cycles of a frequency reference that transpire during the interval. This method is inherently very accurate if the time interval is long enough and the frequency of the reference is high enough. It is simple and inexpensive to manufacture for any resolution, since no more components are needed for high resolution than for low resolution, other than a slightly larger digital counter, but the complexity of the counter is usually of no consequence, since the number of digital flip-flop counting elements needed is no more than the bits of accuracy of the converter. The principle disadvantage of the charge integrating converter is that on average it requires as many steps to complete one conversion as there are analog levels to resolve. Where the flash converter requires only one step to measure N analog voltage levels, and the SAC requires the base 2 logarithm of N steps to measure N levels, the charge-integrating converter requires at least N steps to measure N levels.

The primary limitation to a shorter conversion time for the charge-integrating converter is that the minimum time resolution of the digital counter circuitry limits the maximum reference frequency that can be used. But if shorter time-intervals could be measured, the integrating converter would otherwise be much faster.

OBJECTS AND ADVANTAGES OF THE PRESENT INVENTION

Accordingly, several objects and advantages of the present invention are that it
(a) provides increased resolution at a given conversion rate and a given level of circuit complexity and manufacturing cost, as compared to ADC's utilized in present day technology;
(b) provides a rate of conversion that approaches or exceeds that of the flash converter, without the attendent disadvantages of complexity, cost, and input capacitance that the flash converter possesses;
(c) provides an improved method of charge-integrating converter that is much faster than existing charge-integrating converters, and potentially competitive with the SAC, or the flash converter;
(d) provides a method for resolving time intervals that are much smaller than those resolvable using standard digital counting logic;
(e) is simple enough to construct as a monolithic integrated circuit.

DRAWING FIGURES

SUMMARY OF THE INVENTION

Figure 1:
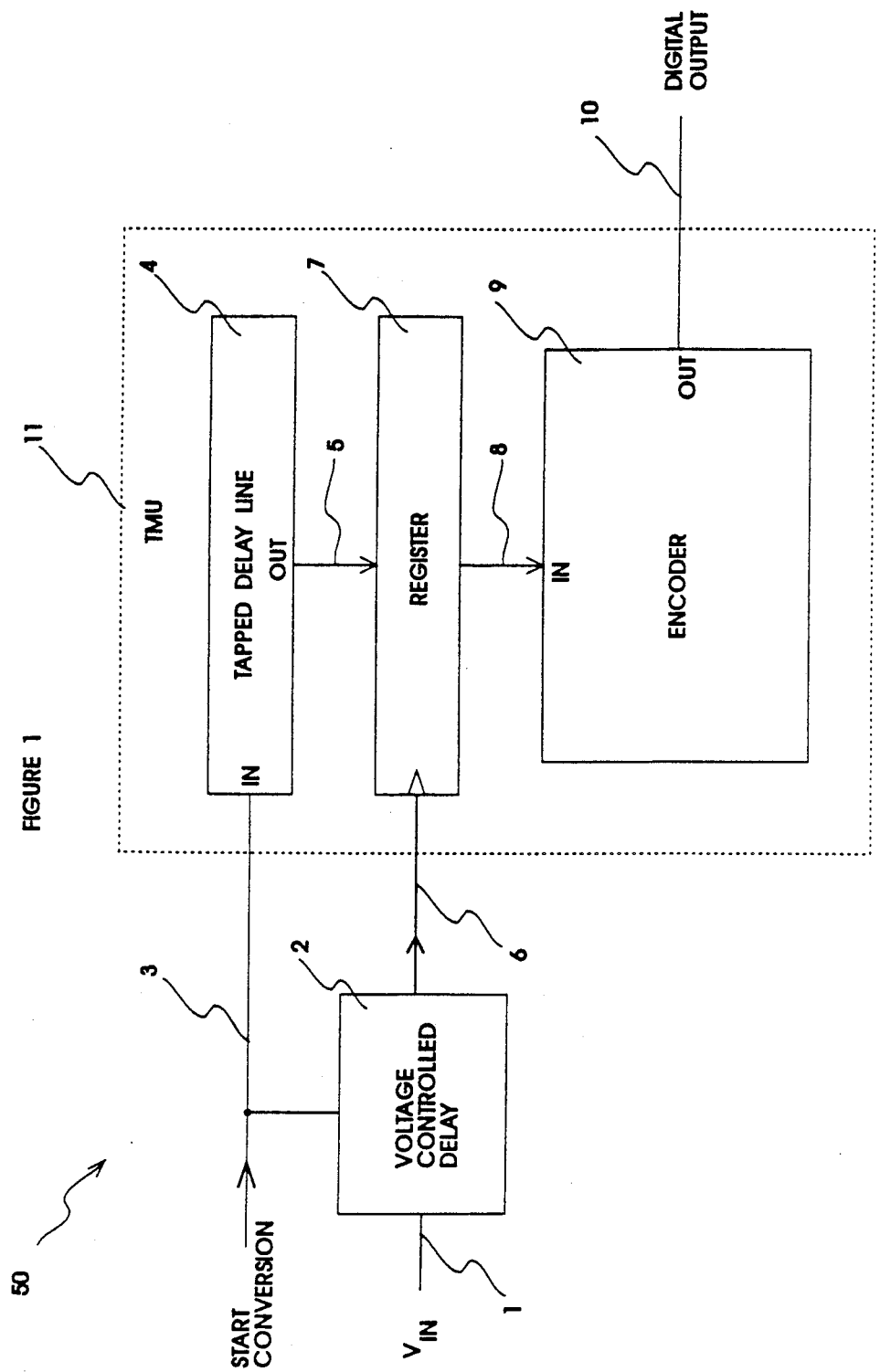
FIG. 1 shows an overall diagram of the first embodiment of the invention being patented.

According to the invention, an analog to digital converter for high-speed, high-accuracy conversion includes a charge storage means for storing an input analog value to be converted, means for controlling discharge of the charge storage means, a comparator means for sensing discharge level of said charge storage means and transmitting a stop signal at a precise time, a tapped delay line means which is responsive to a start signal to generate a sequence of binary values, a first register means responsive to the stop signal for capturing the binary values corresponding to a delay time between the start signal and the stop signal, and an encoder means coupled to the register means for converting the binary values to a digital value representative of the input analog value. In a further embodiment, a counter means and a second register means are employed in parallel with the tapped delay line means and the first register means in connection with a frequency reference to provide digital conversion over a wide dynamic range, the first register means and the tapped delay line means capturing input binary values over at least one cycle of the frequency reference which is one count of the counter.

REFERENCE NUMERALS IN DRAWINGS 1-4:

1 An analog voltage input signal line.
2 A voltage controlled delay element, or VCD.
3 A start-of-conversion, or SOC input signal line.
4 A tapped delay line element, or TDL.
5 A bus consisting of a plurality of output signal lines from TDL 4.
6 An end-of-conversion, or EOC digital signal line from VCD 2.
7 A memory register element for storing the signals on bus 5 upon command of the EOC signal on line 6.
8 A bus consisting of a plurality of digital output signal lines from register 7.
9 An encoder element to translate the signal values on bus 8 into alternative digital signal values on bus 10.
10 A bus consisting of a plurality of digital output signal lines from encoder 9, functioning as the final ADC output.
11 A time-measurement unit comprised of elements 4 and 7 in FIG. 1.
12 A switch for connecting analog input line 1 to capacitor 13, current source 14, and comparator 15.
13 A capacitor element that is charged to the analog input when switch 12 is closed, and discharged when switch 12 is opened upon command of SOC line 3.
14 A constant current source for discharging capacitor 13 when switch 12 opens.
15 A comparator for sensing when capacitor 13 has discharged to zero after switch 12 opens.
16-20 Fixed delay elements comprising the tapped delay line 4.
21-25 Signal outputs from each fixed delay element 16-20 comprising the TDL 4.
31 Time measurement unit in the second embodiment of the invention.
32 A frequency reference signal in the second embodiment of the invention.
33 A frequency reference element in the second embodiment of the invention.
34 A counter in the second embodiment of the invention.
35 A bus comprising the output of counter 34 in the second embodiment of the invention.
37 A memory register element to store the signal on bus 35 in the second embodiment of the invention.
38 A bus comprising the output lines from register 37.
39 Encoding means in the second embodiment of the invention.
50 The first embodiment of the invention.
51 The second embodiment of the invention.

STRUCTURE OF A FIRST EMBODIMENT OF THE INVENTION

A typical embodiment of the invention is shown in FIG. 1. An analog input signal line 1 is applied to a voltage controlled delay element 2, herein called a VCD. Following the detection of a digital signal on start-of-conversion line 3, the VCD element 2 transmits a digital signal on end-of-conversion line 6 after waiting a time interval that is proportional to and controlled by the analog signal on line 1. In the description that follows hereafter, the end-of-conversion signal will be referred to as the EOC, while the start-of-conversion will be referred to as the SOC.

Figure 2:
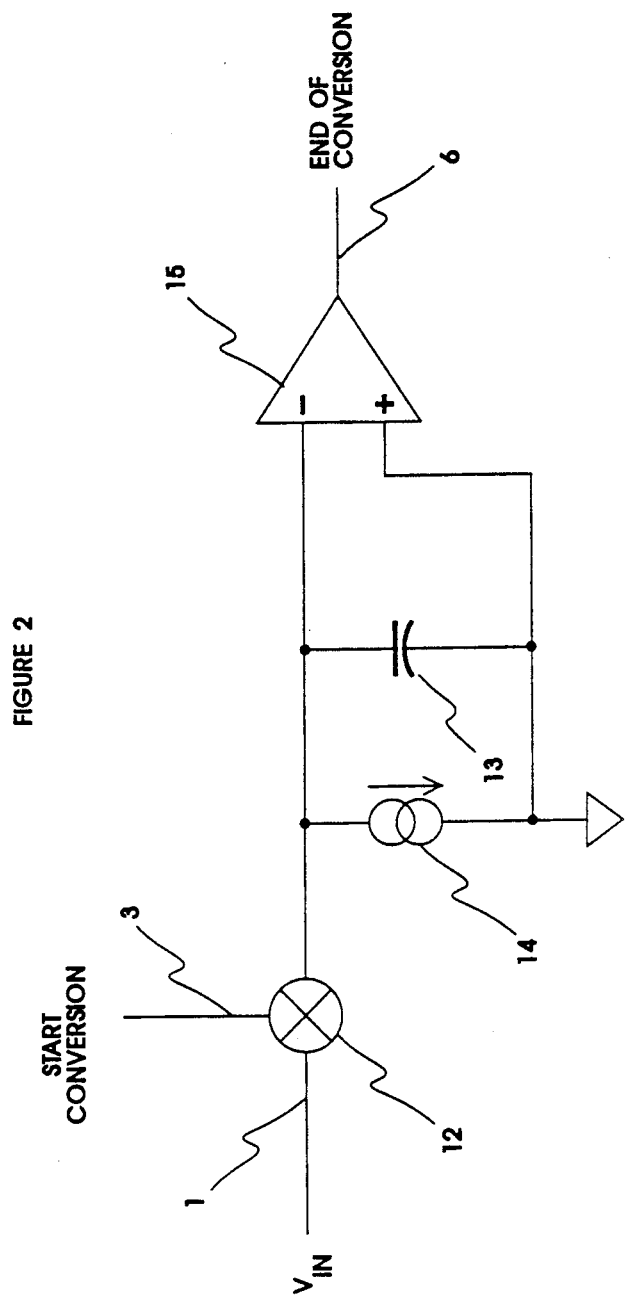
FIG. 2 shows detail of the voltage-controlled delay element from the system of FIG. 1.
Figure 3:
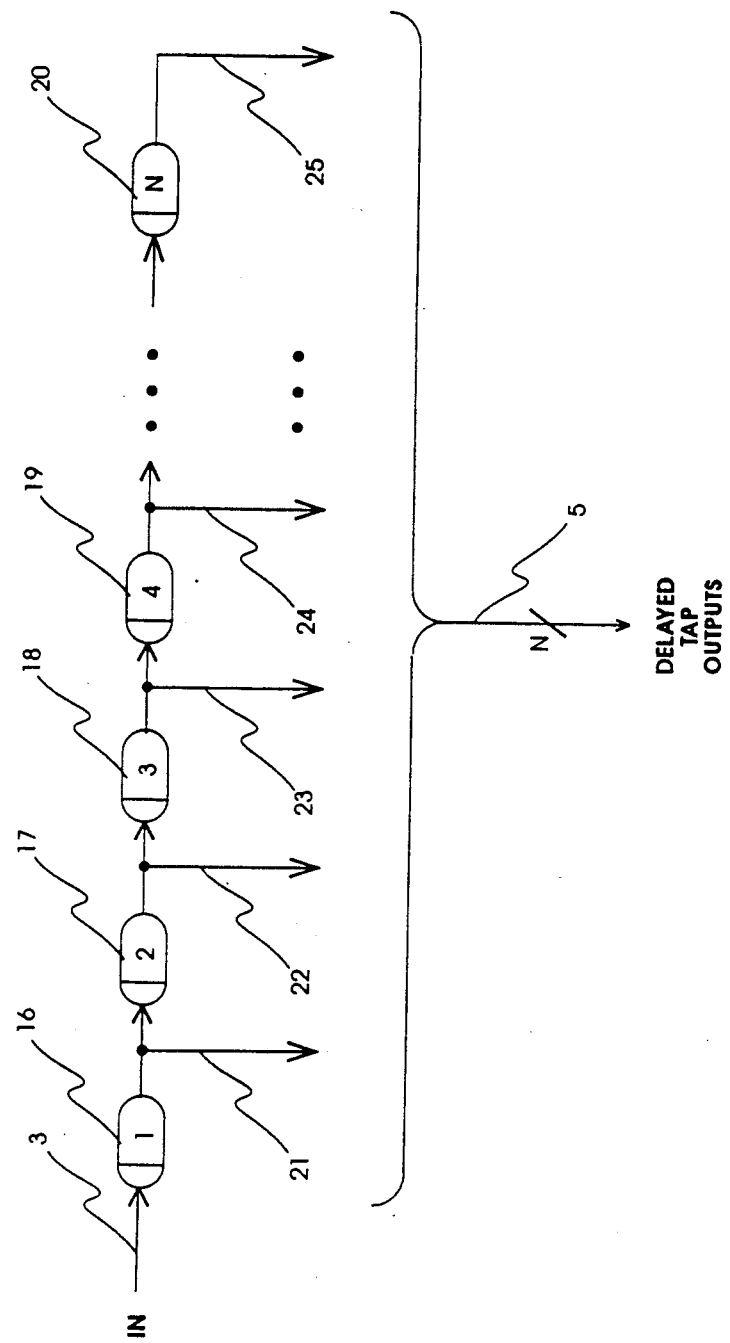
FIG. 3 shows detail of the tapped delay line element from the system of FIG. 1.

The SOC signal is also applied to tapped delay line element 4, herein referred to as the TDL element. The TDL is comprised of a cascaded sequence of fixed delay elements 16–20, as shown in FIG. 2. In FIG. 2, the reference designations 16–20 are intended to indicate that there may be any number of fixed delay elements between elements 16 and elements 20, where elements 16, 17, 18, and 19 are merely the beginning elements in the cascade, and element 20 is the last element in the cascade. The number of elements 16–20 is at least equal to the number of analog voltage levels that are sensed by the ADC. For example, if there are 1024 voltage levels sensed by the ADC, then there must be at least 1024 delay elements 16–20.

Each signal line output 21–25 from every fixed delay element 16–20 is tapped for the purpose of sampling by memory storage register element 7, hence the name "tapped delay line" for TDL 4. The plurality of tapped signal lines 21–25 comprise output bus 5 of the TDL. Bus 5 is the input to memory storage element register 7. Register 7 is constructed from a plurality of individual memory storage elements to store the signal from each line 21–25 comprising bus 5. Register 7 stores the signals comprising bus 5 in response to the EOC signal on line 6, and displays the plurality of stored signals on the plurality of signal lines comprising bus 8. The signal on bus 8 is encoded by means 9. Encoder 9 translates each possible signal value of bus 8 into a new digital signal pattern on bus 10. Bus 10 comprises the output bus of the ADC.

OPERATION OF THE FIRST EMBODIMENT OF THE INVENTION

A first embodiment of the present invention is shown in FIG. 1. Upon reception of a start-conversion signal on line 3 by VCD 2, the VCD 2 generates a digital signal on end-of-conversion signal line 6 (EOC). The EOC signal on line 6 is generated after a delay period that is controlled by the analog input voltage on line 1. The delay period from the SOC on line 1 and the EOC on line 6 is generally proportional to the signal value on line 1 measured at the moment the start-of-conversion signal on line 3 is generated.

The start conversion signal on line 3 is also detected by TDL element 4, initiating a sequential excitation of each delay element 16–20. This has the effect that the SOC signal on line 3 propagates successively through each delay element of the TDL 4 in a manner similar to a transmission line. Consequently, each output 21–25 successively displays the signal waveform of the SOC signal.

For example, assume that before the start conversion signal the logical value on line 3 is a zero, and that after the start conversion signal the logical value on line 3 is a one, and further assume that the output of every fixed delay element 16–20 in the TDL 4 is initially at a logical value of zero. At the instant of the SOC, every output 21–25 remains zero, but after the delay time of element 16 elapses, output 21 assumes a logical value of one, while outputs 22–25 remain at a logical zero. After the additional delay time of element 17 has elapsed, the outputs 21 and 22 of elements 16 and 17 both assume a logical value of one, while the outputs 23–25 of elements 18–20 remain a logical zero. After additional delay time of element 18 elapses, output lines 21–23 of elements 16–18 assume a logical one value, while output lines 24–25 of elements 19–20 remain logically zero. This process continues as time elapses, until all output lines 21–25 of the TDL 4 have assumed a logic value of one. In general, the outputs 21–25 assume the value of the input signal to the TDL, after appropriate delay intervals of the respective tap outputs have elapsed. It may also be true that more than one value of the SOC signal may propagate through the TDL 4 at any one time.

The number of delay elements 16–20 that must comprise the TDL 4 is equal to at least the number of time intervals that must be resolved by the time measurement unit 11. The largest time interval that is measurable by the TDL 4 is just the sum of all the delay intervals of the fixed delay elements 16–20. When a SOC signal from line 3 begins propagating through the TDL 4, output lines 21–25 begin changing value in sequence, in the manner just described. Simultaneously with this event, VCD switch 12 of FIG. 2 opens in response to the SOC 3, capturing the analog voltage input on capacitor 13, and initiating a discharge of capacitor 13 via the action of current source 14. When capacitor 13 decays to zero voltage, comparator 15 generates a digital transition on line 6, signaling the end of the discharge period. This transition on line 6 is the end-of conversion signal, EOC. The EOC signal activates the storage action of register 7, which captures and holds the state of the TDL output signal on lines 21–25 in that instant. After the EOC event has passed, the TDL 4 continues to change state as the SOC propagates through it, but this is of no consequence for subsequent operation.

The captured TDL state that is stored in register 7 and displayed on bus 8 represents what is defined here as a linear-coded representation of the analog input 1. Ideally in this linear-coded representation, the value of bus 8 is equal to 0000 . . . 0 if analog input line 1 is zero volts at the moment the SOC signal is generated, or to 1111 . . . 1 if the analog input 1 is some full-scale value when the SOC is generated, and intermediate values are proportionately represented. For example, if 1024 voltage levels of line 1 are sensed by the ADC 50, and the input is one-half scale, then, at the instant the EOC signal is generated, the signal values of all 1024 lines comprising bus 5 are 512 one's followed by 512 zero's. These three representations for zero scale, full-scale, and mid-scale represent the ideal pattern that arises on bus 5 when the SOC signal on line 3 assumes a logical one value at the beginning of the conversion process. Similar, but equivalent linear-coded descriptions of the analog representation on bus 5 apply if the SOC signal on line 3 assumes a logical zero value at the initiation of the conversion process, except that the pattern of logical one and zero values on bus 5 would be reversed to zero and one values. Furthermore, it is possible for the SOC signal to be a more complex waveform, but similar linear-coded descriptions still apply for identifying a measured time interval or input voltage 1. None of these particular representations is to be construed as specific to the claims of the present invention.

Once register 7 captures the signals on bus 5 and displays them on bus 8, encoder 9 translates the plurality of signals on bus 8 into a new digital signal pattern on bus 10. For the reasons of economy and utility required by most applications, bus 10 generally has fewer signal lines than bus 8, and generally is coded in a binary one's complement or two's complement digital representation of the analog input voltage 1. These digital representations are well known to those skilled in the art, and are not the only possible representations. No representation of the signal relationship between the output 10 and the input 1 should be construed as particular to this invention, but for the purposes of demonstrating operation, the one's and two's complement representations are useful.

For example, if bus 8 is comprised of 1024 signal lines, a one's complement translation by encoder 9 requires just ten signal lines for bus 10. The binary pattern 0000000000 of signal values on bus 10 might then correspond to a zero voltage input and to a binary pattern of 1024 zero's on bus 8. A binary pattern 1000000000 on bus 10 would then correspond to one-half the maximum voltage input, and would also correspond to a sequence of 512 one's followed by 512 zero's on bus 8. Similarly, 1111111111 would correspond to a maximum voltage input, and would also correspond to 1024 one's on bus 8. This example only corresponds to an ideal implementation of the ADC described in the present invention. In practice, distorting error sources in other elements comprising the ADC 50, such as the VCD 2 or the TDL 4, may not give an exact linear correspondence between the voltage input 1 and the binary waveform on bus 8.

For example, a zero voltage input may give rise to a binary value of one on both of the first two delay line outputs 21–22 of TDL 4 at the moment the EOC signal is generated. This can arise because of an unavoidable delay between the instant that the voltage on capacitor 13 discharges to zero and the instant that the output of comparator 15 can transition to a value that register 7 can respond to. Such an error source applies a fixed offset to the measurement of the signal propagation of SOC 3 through TDL 4 as displayed on bus 5. Other possible error sources known to those in skilled in the art include scale factor errors, differential linearity errors, and integral linearity errors. All such error sources arise from design compromises, manufacturing tolerances, environmental conditions such as temperature or mechanical stress, aging, and so forth. Thus, besides translating the linear-coded signal on bus 8 into a more compact base 2 form, another function of the encoder 9 can be to correct for distortion in the conversion process between the analog input and the sampled delay line output on bus 8.

As mentioned previously, the resolution of an analog-to-digital converter built by the method of the present invention is set by the number of fixed delay elements 16–20 that the SOC signal can propagate through in the time it takes a full-scale analog input voltage to be discharged to zero on capacitor 13. For example, if a five volt input can be discharged in one microsecond, and the fixed delay interval of elements 16–20 are one nanosecond, then the converter resolution is one part in 1000, or five millivolts.

The conversion time in this first embodiment of the present invention is given by the maximum number of voltage levels that can be resolved, corresponding to a full-scale input, times the average delay time value of fixed delay elements 16–20. In the example just cited, the average conversion time to obtain a value on bus 8 following the generation of an SOC signal on line 3 is one nano-second times 1000, or one microsecond.

During cyclic operation, the conversion rate of the present invention is limited by the smallest fixed delay elements 16–20 that can be manufactured. It is a fact that in many electronic manufacturing processes, the smallest delay that can be constructed from logic circuit elements such as invertors or flip-flop's are appreciably longer than the smallest delay that can be constructed by other circuit means, using the same manufacturing technology. Examples of circuit elements with shorter delay times include a suitably designed filter made from resistors and capacitors, a linear amplifier, or a short transmission line. By using these or other unspecified elements, the tapped delay line method of time measurement of the present invention offers the advantage of a means for measuring time intervals that can be considerably shorter than those of the conventional logic counting circuit, and thus a means of constructing a charge integrating converter that is considerably faster than has been previously described.

A SECOND EMBODIMENT OF THE INVENTION

Figure 4:
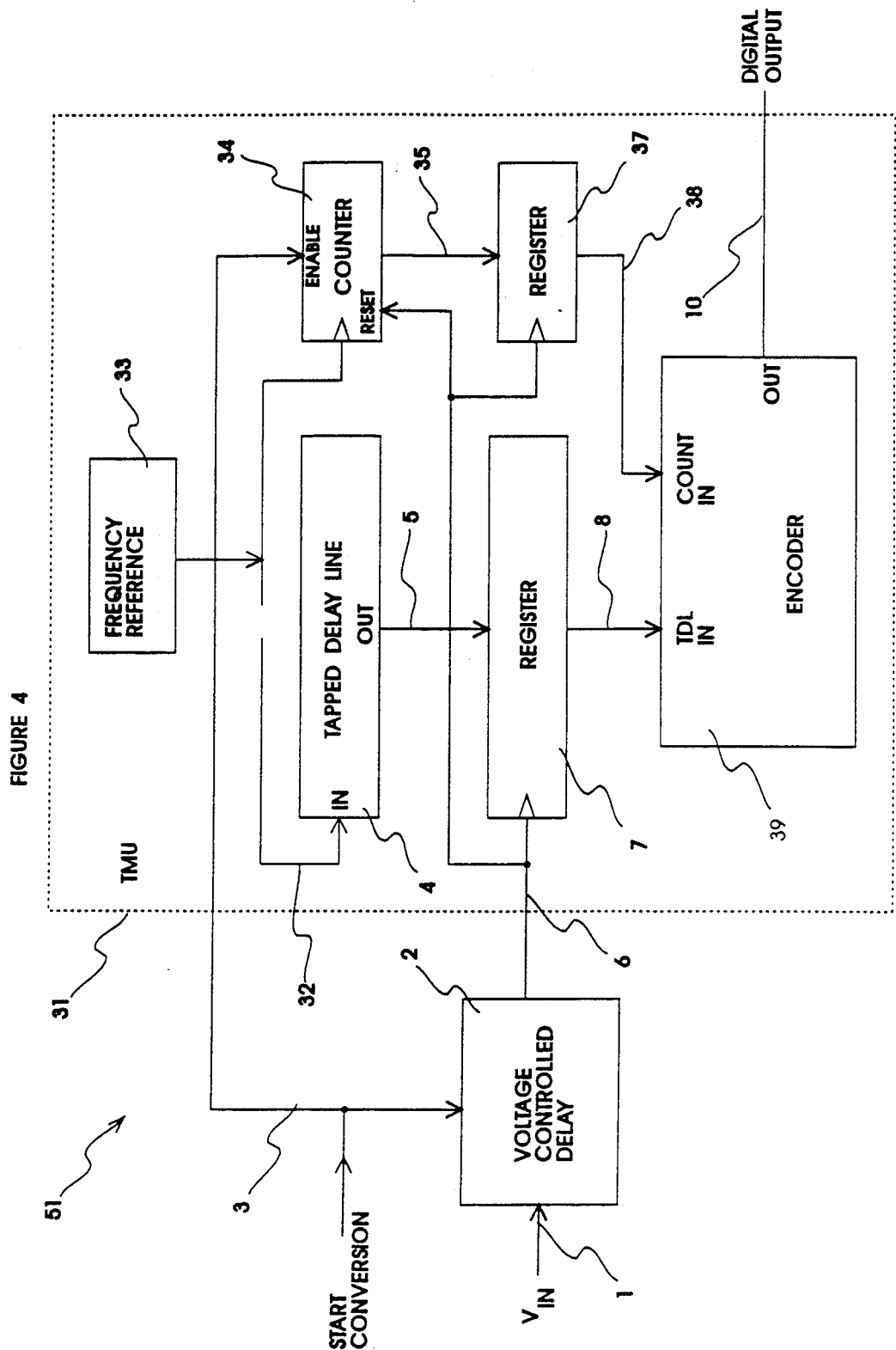
FIG. 4 shows an overall diagram of the second embodiment of the invention.

An alternative second embodiment of the present invention is constructed by utilizing both the delay-line method of time measurement as described in the first embodiment of the present invention, together with the counting method of time measurement as utilized in the charge integrating methods previously referenced (U.S. Pat. No. 2,801,281, et al). This second embodiment of the invention is consistent with the first embodiment in regard to the particulars of the VCD 2, the time measurement unit 11, the encoder 9, signal lines 3 and 6 for SOC and EOC, respectively, and bus 10. The operating principle of time-measurement in this second embodiment is essentially the same as in the first embodiment, though the details of the time measurement unit 11 are modified, as indicated in FIG. 4, the overall diagram for the second embodiment. The time measurement unit will herein be referred to as the TMU, and identified in FIG. 4 as means 31, to differentiate it from the particular TMU embodiment 11 of FIG. 1. Other elements that have no special consequence for the second embodiment as apart from the first embodiment retain the same designations in FIGS. 1 and 4. These elements include VCD 2, TDL 4, analog input 1, SOC 3, EOC 6, register 7, bus 5, bus 8, and digital output bus 10.

In the second embodiment of the present invention, the TMU 31 precisely measures the discharge time interval of the VCD 2 by two methods that discriminate both a coarse time measurement and a fine time measurement. The coarse time measurement operates on the counting method of previous charge integrating methods, and the fine time measurement operates by the tapped delay line principle described in the first embodiment.

OBJECTS AND ADVANTAGES OF THE SECOND EMBODIMENT OF THE INVENTION

The object of the second embodiment is to measure longer time intervals to greater resolution than is practical using the method of the first embodiment. In the first embodiment, the complexity of the TDL 4, register 7, and encoder 9 increases approximately linearly as the resolution of the ADC 50 increases. Given a TDL using fixed delay elements 16–20 that already have a delay time that is as short as can be constructed in the manufacturing technology being employed, the only way to increase resolution is to increase the measurement interval. Since this measurement interval grows with resolution required, it may exceed the resolution that is discriminable by a practical TDL, and if it does, it becomes necessary to supplement the tapped delay line method with the counting method. By this method, a counter resolves the time difference between signal SOC 3 and EOC 6 by counting during the measurement interval an integral number of cycle periods of some frequency reference, and measuring the residual interval between the last count and the EOC with a TDL method.

For example, a 16-bit converter with a resolution of 2 16=65,536 analog levels requires at least 65,536 fixed delay line elements in the TDL 4 of FIG. 1, and 65,536 bits of storage in register 7. If the minimum resolvable time interval for elements 16-20 is 100 picoseconds, and if the minimum discriminable time interval for a counter in the given manufacturing technology is 10 nanoseconds, then a preferred method of conversion is to use a 128 tap TDL to measure the least significant seven bits of the analog levels, and to use a 9 bit counter to measure the most significant bits. That is to say, the counter would resolve the discharge time measurement to within 10 nano-seconds, and the TDL would resolve the residual to 100 pico-seconds. The savings in complexity between a 65,536 tap TDL versus a 128 tap TDL plus a 9 bit counter are clearly enormous.

Whereas the method time measurement by tapped delay line works well for measuring small time intervals, but is excessively complex for measuring fine resolution, and whereas the counting method cannot measure time to the resolution of the tapped delay line, but economically measures long time intervals to a fine resolution, it is an object of the second embodiment of the present invention to combine the two methods into a new method that has the advantages of both but neither of the disadvantages, to wit, into a method that is economically simple and fast at high resolution, wherein the method of counting economically measures longer time intervals which it is capable of discriminating, and the TDL measures the shorter time intervals that arise between the periodic time intervals that the counters discriminates.

It will be observed that the time measurement of the discharge time of a capacitor by a counter is not essentially different in principle from the charge integrating methods in the cited references, and so it is a distinctive feature and advantage of this second embodiment that it incorporate a TDL element as part of the time measurement process.

By way of summary, the advantages of the second embodiment of the present invention are
(a) less complexity for faster, higher resolution ADC as compared to the method of the first embodiment;
(b) faster operation at high resolution, as compared to the previous charge integrating methods using the method of counting.

STRUCTURE OF THE SECOND EMBODIMENT OF THE INVENTION

The TMU 31 of FIG. 4 differs from the TMU 11 of FIG. 1 by the inclusion of a counter to supplement the TDL 4 of the first embodiment. The TMU 31 is otherwise very similar in operation, in that it is controlled by the SOC signal on line 3 and the EOC signal on line 6, and displays the measurement result on a composite bus comprised of bus 8 and bus 38.

Internally, the TMU 31 of FIG. 4 is configured with a counter 34 that senses the signal 32 from frequency reference generator 33. The counting action of counter 34 is enabled by the SOC signal on line 3. Unlike the first embodiment, the input to TDL 4 is not the SOC signal 3, but the frequency reference signal 32. As in the first embodiment, register 7 latches the output of the TDL upon command of the EOC signal line 6, but unlike the first embodiment, the TMU 31 is supplemented by a register 37 that stores the signal of output bus 35, and displays it on bus 38. Both bus 8 and bus 38 are together encoded by digital logic means 39 in a manner similar to encoder 9 in the first embodiment. The encoded signal of means 39 is displayed on bus 10 of FIG. 4, the digital output of this second embodiment of the ADC.

OPERATION OF A SECOND EMBODIMENT OF THE INVENTION

The second embodiment of FIG. 4 operates similarly to the first embodiment of FIG. 1. Reference numerals in the subsequent discussion refer exclusively to FIG. 4.

The SOC signal 3 initiates the conversion process by opening switch 12 in the VCD 2, allowing the discharge of capacitor 13 to begin from the level of the input voltage on line 1 at the moment switch 12 opens. In this embodiment the SOC signal 3, besides enabling the discharge of capacitor 13, also enables the operation of a counter 34, which then responds to the frequency reference signal on line 32, and measuring the number of cycles of the signal on line 32 that transpire over the elapsed time interval between the SOC signal on line 3, and the EOC signal generated on line 6. When the EOC signal 6 is generated, it commands the memory means of register 37 to capture the accumulated count displayed on bus 35, and to display it on bus 38. Thus, after the generation of the EOC signal on line 6, register 37 displays a coarse measurement of the accumulated number of periods of the frequency reference signal 32 during the discharge time interval of the VCD 2. After the EOC on line 6, register 37 does not display any of the residual time difference that must be measured between the registration of the last frequency cycle in counter 34 and the moment the EOC is generated. The residual time difference in this second embodiment is measured by the TDL 4.

The TDL 4 of this second embodiment measures the residual time interval between a given clock period and the occurence of the EOC signal, using essentially the same method as discussed in the first embodiment, except that instead of propagating the SOC signal as in the first embodiment, the TDL in the second embodiment propagates the frequency reference signal 32. Like the first embodiment, however, the delayed waveform on bus 5 is stored in register 7 and displayed on bus 8 by the action of the EOC 6. The residual time interval is measured simply by associating a particular signal pattern on bus 8 with a previously measured delay time programmed into encoder 39.

After generation of the EOC 6, register 37 and register 7 display the complete precise time measurement of the discharge period of VCD 2. Register 37 displays the coarse measurement in units of cycles of the frequency reference signal on line 32, whereas register 7 displays a fine measurement of the residual time in units of the tapped delay line elements 16-20. The function of digital logic encoding means 39 is to translate these two measurements, as they are displayed on bus 8 and bus 38, into one's complement or two's complement representation, and to display the encoded result on output bus 10 of the ADC. The encoder 39 is used for the same reasons and in the same manner as was described in the first embodiment of the invention. As with the first embodiment of the invention, the particular encoded representation displayed on bus 10 is not particular to the present invention.

It must be noted that to obtain uniform and consistent measurement by the method of this second embodiment, it is necessary that the SOC on line 3 by synchronized with respect to some constant phase of the frequency reference signal 32. Otherwise, a random error of approximately one period of the frequency reference will be introduced into the time measurement. This is unlike the first embodiment, wherein the SOC 3 may be controlled asynchronously.

Also, in this second embodiment it is to be noted that the TDL 4 requires a total propagation delay that is no longer than approximately one clock period of the frequency reference signal on line 32.

SUMMARY, RAMIFICATIONS, SCOPE

The reader will see that the conversion device presented here according to the method of time measurement by a tapped delay line can be used to convert analog signals into a digital representation. This invention has the advantages that (a) It works by a principle that is simple in concept to design,
(b) if the TDL 4 is constructed using elements 16–20 having a suitably short delay interval, the present invention can provide very high resolution at conversion rates much higher than previous charge-integrating converters,
(c) it possesses an input capacitance which does not grow in proportion to the resolution of the ADC,
(d) it is less complex and more economical to construct than an equivalent high-resolution flash converter,
(e) it is simple enough to construct as a monolithic integrated circuit.

Although the description above contains many specificities, these should not be construed as limiting the scope of the invention, but as merely providing illustrations of some of the presently preferred embodiments of this invention. For example, the VCD 2 may not have a switch 12, or the TDL 4 and the register 7 may be combined into one circuit element, or the encoding element 9 may not be utilized.

Thus, the scope of the invention should be determined by the appended claims and their legal equivalents, rather than by the examples given.

I claim:

1. An analog to digital converter apparatus comprising:
    a charge storage means for storing an input analog value to be converted;
    means coupled to said charge storage means for controlling discharge of the charge storage means;
    a comparator means coupled to said charge storage means for sensing discharge level of said charge storage means and transmitting a stop signal at a precise time;
    a tapped delay line means coupled to receive a start signal, said tapped delay line means being responsive to the start signal to generate a sequence of binary values;
    a first register means coupled to receive in parallel said sequence of binary values from said tapped delay line means for capturing binary values corresponding to a delay time between the start signal and the stop signal; and
    an encoder means coupled to the first register means for converting the binary values to a digital value representative of the input analog value.

2. The analog to digital converter according to claim 1 wherein said discharge controlling means is a constant current source for providing a substantially constant and linear discharge of said charge storage means.

3. The analog to digital converter according to claim 2 wherein said start signal is a constant binary level signal representative of a binary one.

4. The analog to digital converter according to claim 2 wherein said start signal is a preselected sequence of binary level signals representative of binary ones and binary zeroes.

5. An analog to digital converter apparatus comprising:
    a charge storage means for storing an input analog value to be converted;
    means coupled to the charge storage means for controlling discharge of the charge storage means;
    a comparator means coupled to the charge storage means for sensing discharge level of the charge storage means and transmitting a stop signal at a precise time;
    frequency reference means for generating a synchronizing signal;
    a tapped delay line means coupled to receive the synchronizing signal, said tapped delay line means being responsive to the synchronizing signal to generate a sequence of binary values;
    a first register means coupled to receive the stop signal and to receive in parallel said sequence of binary values from the tapped delay line means for capturing binary values corresponding to a delay time between the synchronizing signal and the stop signal;
    a counter means coupled to receive a start signal and a frequency reference, the synchronizing signal and the stop signal for counting frequency cycles between the start signal and the stop signal;
    means for capturing binary values corresponding to a count between the start signal and the stop signal; and
    an encoder means coupled to the first register means for converting first binary values to a digital value representative of least significant bits of the input analog value and coupled to the second register means for converting second binary values to a digital value representative of most significant bits of the input analog value in order to provide digital conversion over a wide dynamic range, the first register means and the tapped delay line means capturing input binary values over at least one cycle of the frequency reference which is one count of the counter means.

6. The analog to digital converter according to claim 5 wherein said discharge controlling means is a constant current source for providing a substantially constant and linear discharge of said charge storage means.

7. The analog to digital converter according to claim 6 wherein said start signal is a constant binary level signal representative of a binary one.

8. The analog to digital converter according to claim 6 wherein said start signal is a preselected sequence of binary level signals representative of a binary ones and binary zeroes.

9. The analog-to-digital converter according to claim 5 wherein said capturing means is a second register means coupled to receive output of the counter means in parallel.

* * * * *